United States Patent
Seo

(10) Patent No.: US 9,449,673 B2
(45) Date of Patent: Sep. 20, 2016

(54) MEMORY DEVICE AND MEMORY SYSTEM HAVING THE SAME

(71) Applicant: Samsung Electronics Co., Ltd., Suwon-si (KR)

(72) Inventor: Seong-Young Seo, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 305 days.

(21) Appl. No.: 14/053,865

(22) Filed: Oct. 15, 2013

(65) Prior Publication Data

US 2014/0189226 A1 Jul. 3, 2014

(30) Foreign Application Priority Data

Jan. 3, 2013 (KR) .................. 10-2013-0000437

(51) Int. Cl.
*G06F 13/12* (2006.01)
*G06F 13/38* (2006.01)
*G11C 11/406* (2006.01)
*G11C 11/4076* (2006.01)

(52) U.S. Cl.
CPC ...... *G11C 11/40622* (2013.01); *G11C 11/4076* (2013.01); *G11C 11/40618* (2013.01)

(58) Field of Classification Search
CPC .................. G11C 11/40622; G11C 11/4076; G11C 11/4061

USPC .......................................................... 710/62
See application file for complete search history.

(56) References Cited

U.S. PATENT DOCUMENTS

| | | | | |
|---|---|---|---|---|
| 9,158,672 B1 * | 10/2015 | Zheng | ................ | G06F 12/0246 |
| 2009/0313420 A1 * | 12/2009 | Wiesz | ................ | G06F 12/0246 |
| | | | | 711/103 |
| 2011/0066899 A1 | 3/2011 | Kang et al. | | |
| 2012/0054419 A1 * | 3/2012 | Chen | .................. | G06F 11/1441 |
| | | | | 711/103 |
| 2012/0110259 A1 * | 5/2012 | Mills | ...................... | G06F 13/00 |
| | | | | 711/113 |
| 2012/0117444 A1 | 5/2012 | Arya | | |

FOREIGN PATENT DOCUMENTS

| | | |
|---|---|---|
| JP | 2005-285184 | 10/2005 |
| JP | 2006-309539 | 11/2006 |
| JP | 2009-037317 | 2/2009 |

* cited by examiner

*Primary Examiner* — Chun-Kuan Lee
(74) *Attorney, Agent, or Firm* — Muir Patent Law, PLLC

(57) ABSTRACT

A memory device includes a memory cell array, a multi-purpose register (MPR) and a control unit. The memory cell array includes a plurality of memory blocks. The multi-purpose register (MPR) stores physical address information for each of the plurality of memory blocks. The control unit outputs the physical address information stored in the multi-purpose register in response to an MPR read command received from a memory controller.

5 Claims, 8 Drawing Sheets

FIG. 4

MEMORY BLOCKS

| 2811 |
|---|
| 2812 |
| ⋮ |
| 281n |

MPR

| BLOCK ADDRESS |
|---|
| RADDL1 |
| RADDL2 |
| ⋮ |
| RADDLn |

FIG. 5

MEMORY BLOCKS

| 2811 |
|---|
| 2812 |
| ⋮ |
| 281n |

MPR

| BLOCK ADDRESS | SPEED |
|---|---|
| RADDL1 | SP1 |
| RADDL2 | SP2 |
| ⋮ | ⋮ |
| RADDLn | SPn |

MEMORY DEVICE AND MEMORY SYSTEM HAVING THE SAME

CROSS-REFERENCE TO RELATED APPLICATION(S)

This application claims priority under 35 USC §119 to Korean Patent Application No. 10-2013-0000437, filed on Jan. 3, 2013 in the Korean Intellectual Property Office (KIPO), the contents of which are herein incorporated by reference in their entirety.

BACKGROUND

Example embodiments relate to a semiconductor device, and more particularly to a memory device and a memory system having the memory device.

In general memory systems, a memory controller controls an operation of a memory device using fixed parameters.

However, a memory device may include a plurality of memory blocks each may have different physical characteristics, and only some of the memory blocks may need to be refreshed.

Therefore, if a memory controller controls an operation of a memory device using fixed parameters, performance of the memory system may be degraded.

SUMMARY

According to example embodiments, a memory device includes a memory cell array, a multi-purpose register (MPR) and a control unit. The memory cell array includes a plurality of memory blocks. The multi-purpose register (MPR) stores physical address information of each of the plurality of memory blocks. The control unit outputs the physical address information stored in the multi-purpose register in response to an MPR read command received from a memory controller.

According to example embodiments, a memory system includes a memory device and a memory controller. The memory device includes a memory cell array and a multi-purpose register (MPR) that stores physical information of a plurality of memory blocks included in the memory cell array. The memory controller controls the memory device and provides an MPR read command to the memory device at startup of the memory system. The memory device provides the physical information stored in the multi-purpose register to the memory controller in response to the MPR read command.

According to example embodiments, a method of operation for a memory system including a memory controller and memory device including a plurality of memory blocks is provided. The method includes receiving physical address information of each of the plurality of memory blocks from the memory device, wherein the physical address information is stored in a multi-purpose register (MPR) of the memory device, and controlling an operation of the memory device based on the received physical address information.

BRIEF DESCRIPTION OF THE DRAWINGS

Illustrative, non-limiting example embodiments will be more clearly understood from the following detailed description in conjunction with the accompanying drawings.

FIG. 4 is a diagram illustrating an example of the multi-purpose register included in the memory device of FIG. 3.

FIG. 5 is a diagram illustrating another example of the multi-purpose register included in the memory device of FIG. 3.

DETAILED DESCRIPTION OF THE EMBODIMENTS

Figure 1:
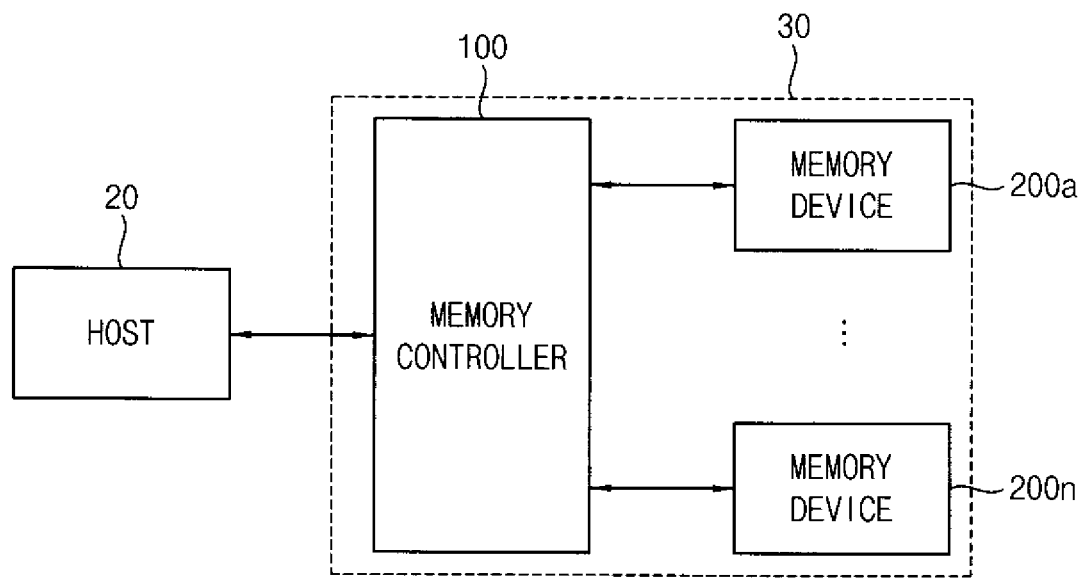
FIG. 1 is a block diagram illustrating an electronic system according to example embodiments.

Various example embodiments will be described more fully with reference to the accompanying drawings, in which some example embodiments are shown. The present inventive concept may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. Unless indicated otherwise, these terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing disclosed embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 includes a host 20 and a memory system 30. The memory system 30 includes a memory controller 100 and a plurality of memory devices 200a~200n.

The host 20 may communicate with the memory system 30 through an interface protocol such as, for example, Peripheral Component Interconnect-Express (PCI-E), Advanced Technology Attachment (ATA), Serial ATA (SATA), Parallel ATA (PATA), or serial attached SCSI (SAS). In addition, the host 20 may communicate with the memory system 30 through an interface protocol such as Universal Serial Bus (USB), Multi-Media Card (MMC), Enhanced Small Disk Interface (ESDI), or Integrated Drive Electronics (IDE).

The memory controller 100 controls overall operation of the memory system 30. The memory controller 100 controls overall data exchange between the host 20 and the memory devices 200a~200n. For example, the memory controller 100 writes data in the memory devices 200a~200n or reads data from the memory devices 200a~200n in response to request from the host 20.

In addition, the memory controller 100 applies operation commands to the memory devices 200a~200n for controlling the memory devices 200a~200n.

In some embodiments, each of the memory devices 200a~200n may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc., or may be other volatile memory devices.

Figure 2:
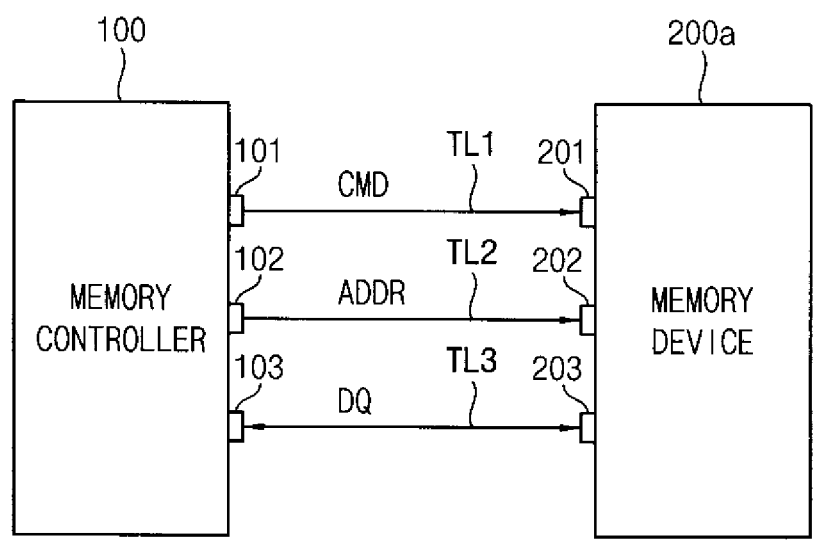
FIG. 2 is a block diagram illustrating an example of the memory system of FIG. 1 according to example embodiments.

FIG. 2 is a block diagram illustrating an example of the memory system of FIG. 1 according to example embodiments.

In FIG. 2, one memory device 200a corresponding to the memory controller 100 is illustrated for convenience.

Referring to FIG. 2, the memory system 30 includes the memory controller 100 and the memory device 200a. The memory controller 100 and the memory devices 200a may be connected to each other through corresponding command pins 101 and 201, corresponding address pins 102 and 202 and corresponding data pins 103 and 203. The command pins 101 and 201 transmit a command signal CMD through a command transmission line TL1, the address pins 102 and 202 transmit an address signal ADDR through an address transmission line TL2, and the data pins 103 and 203 exchange data DQ through a data transmission line TL3.

Referring to FIGS. 1 and 2, the memory controller 100 may provide an address to the memory device 200a through the address pins 102 and 202 and input data to the memory device 200a or output data from the memory device 200a through the data pins 103 and 203 based on the request from the host 20.

Figure 3:
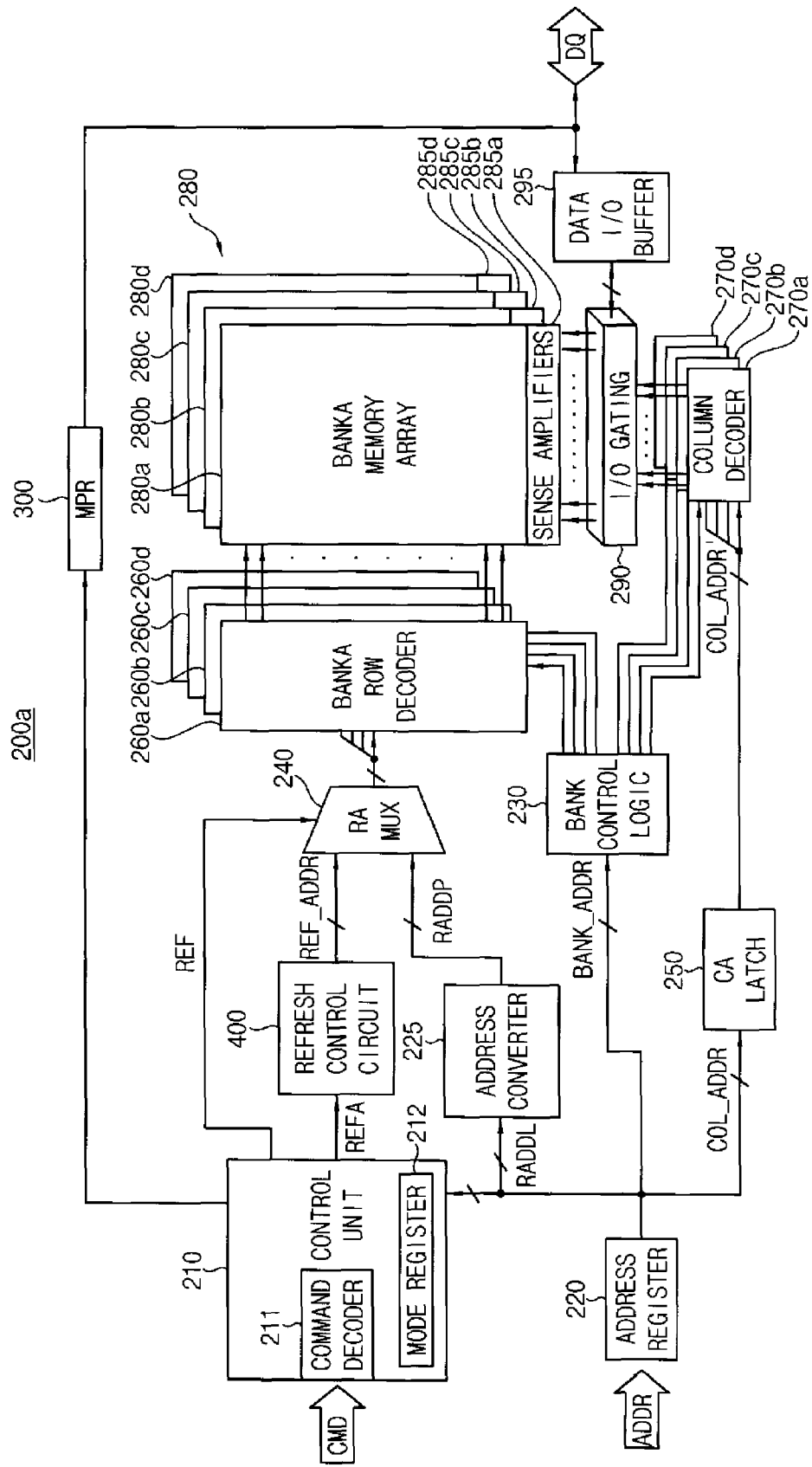
FIG. 3 is a block diagram illustrating an example of the memory device of FIG. 2 according to example embodiments.

FIG. 3 is a block diagram illustrating an example of the memory device of FIG. 2 according to example embodiments.

Referring to FIG. 3, the memory device 200a includes a control unit 210, an address register 220, a bank control logic 230, a row address multiplexer 240, a column address latch 250, a row decoder, a column decoder, a memory cell array 280, a sense amplifier unit, an input/output gating circuit 290, a data input/output buffer 295, an address converter 225, a multi-purpose register MPR 300 and a refresh control circuit 400.

The memory cell array 280 may include first through fourth bank arrays 280a, 280b, 280c and 280d. Each of the first through fourth bank arrays 280a, 280b, 280c and 280d may include a plurality of memory blocks. Each of the plurality of memory blocks may have different physical characteristics. For example, operation speeds of the plurality of memory blocks may be different from each other. Each of the plurality of memory blocks may include a plurality of pages. For example, one page may include one row of memory cells.

The row decoder may include first through fourth bank row decoders 260a, 260b, 260c and 260d respectively coupled to the first through fourth bank arrays 280a, 280b, 280c and 280d. The column decoder may include first through fourth bank column decoders 270a, 270b, 270c and 270d respectively coupled to the first through fourth bank arrays 280a, 280b, 280c and 280d. The sense amplifier unit may include first through fourth bank sense amplifiers 285a, 285b, 285c and 285d respectively coupled to the first through fourth bank arrays 280a, 280b, 280c and 280d.

The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks Although the memory device 200a is illustrated in FIG. 3 as including four banks, the memory device 200a may include any number of banks The control unit 210 may control operations of the memory device 200a. For example, the control unit 210 may generate control signals for the memory device 200a to perform a write operation or a read operation. The control unit 210 may include a command decoder 211 that decodes the command signal CMD received from the memory controller 100 and a mode register 212 that is used to set an operation mode of the memory device 200a. For example, the command decoder 211 may generate the control signals corresponding to the command signal CMD by decoding a write enable signal (/WE), a row address strobe signal (/RAS), a column address strobe signal (/CAS), a chip select signal (/CS), etc. The control unit 210 may further receive a clock signal (CLK) and a clock enable signal (/CKE) for operating the memory device 200a in a synchronous manner.

The address register 220 may receive the address signal ADDR including a bank address BANK_ADDR, a logical row address RADDL and a column address COL_ADDR from the memory controller 100. The address register 220 may provide the bank address BANK_ADDR to the bank control logic 230, provide the logical row address RADDL to the address converter 225, and provide the column address COL_ADDR to the column address latch 250.

The address converter 225 may convert the logical row address RADDL into a physical row address RADDP indicating a row of memory cells included in the memory cell array 280 and provide the physical row address RADDP to the row address multiplexer 240. The address converter 225 may include an address mapping table, which stores logical row addresses RADDLs of rows of memory cells included in the memory cell array 280 in relation with physical row addresses RADDPs of rows of memory cells included in the memory cell array 280, for converting the logical row address RADDL into the physical row address RADDP.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the physical row address RADDRP from the address converter 225 and receive a refresh row address REF_ADDR from the refresh control circuit 400. The row address multiplexer 240 may output one of the physical row address RADDRP and the refresh row address REF_ADDR in response to the refresh signal REF received from the control unit 210. The control unit 210 may generate the refresh signal REF based on an auto refresh command received from the memory controller 100 or generate the refresh signal REF internally in a self refresh mode. A row address output from the row address multiplexer 240 may be applied to the first through fourth bank row decoders 260a, 260b, 260c and 260d.

The activated one of the first through fourth bank row decoders 260a, 260b, 260c and 260d may decode the row address received from the row address multiplexer 240 and activate a word line corresponding to the row address. For example, the activated bank row decoder may apply a word line driving voltage to the word line corresponding to the row address.

The column address latch 250 may receive the column address COL_ADDR from the address register 220 and temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the first through fourth bank column decoders 270a, 270b, 270c and 270d.

The activated one of the first through fourth bank column decoders 270a, 270b, 270c and 270d may decode the column address COL_ADDR' received from the column address latch 250 and control the input/output gating circuit 290 to output data corresponding to the column address COL_ADDR'.

The input/output gating circuit 290 may include a circuitry for gating input/output data. The input/output gating circuit 290 may further include an input data mask logic, read data latches for storing data received from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array and be stored in the read data latches. The data DQ stored in the read data latches may be provided to the memory controller 100 via the data input/output buffer 295. Data DQ to be written to one bank array of the first through fourth bank arrays 280a, 280b, 280c and 280d may be provide from the memory controller 100 to the data input/output buffer 295. The data DQ provided to the data input/output buffer 295 may be written to the one bank array via the write drivers.

The multi-purpose register 300 may store physical information of each of the plurality of memory blocks included in the memory cell array 280.

At startup (e.g., power up) of the memory system 30, the memory controller 100 may provide a MPR read command to the control unit 210 of the memory device 200a, and the control unit 210 may provide the physical information stored in the multi-purpose register 300 to the memory controller 100 in response to the MPR read command. For example, the physical information stored in the multi-purpose register 300 may be transmitted through a data DQ pin.

In some example embodiments, the physical information stored in the multi-purpose register 300 may include address information of each of the plurality of memory blocks.

For example, as illustrated in FIG. 4, when the memory cell array 280 includes first through n-th memory blocks 2811, 2812, ..., 281n, the multi-purpose register 300 may store start addresses RADDL1, RADDL2, ..., RADDLn of each of the first through n-th memory blocks 2811, 2812, ..., 281n. For example, the control unit 210 may consecutively provide the start addresses RADDL1, RADDL2, ..., RADDLn of the first through n-th memory blocks 2811, 2812, ..., 281n stored in the multi-purpose register 300 to the memory controller 100 in response to the MPR read command.

Alternatively, when each of the plurality of memory blocks included in the memory cell array 280 have the same size, the multi-purpose register 300 may store a start address of the memory cell array 280 and the size of each of the plurality of memory blocks. For example, the control unit 210 may provide the start address of the memory cell array 280 and the size of each of the plurality of memory blocks stored in the multi-purpose register 300 to the memory controller 100 in response to the MPR read command.

Since the memory controller 100 receives the start addresses of each of the plurality of memory blocks included in the memory cell array 280 from the memory device 200a at startup of the memory system, the memory controller 100 may keep track of memory blocks at which a read operation and/or a write operation is performed and keep track of memory blocks in which data is currently stored. The memory blocks that do not store data may not need to be refreshed. Therefore, the memory controller 100 may not refresh all of the plurality of memory blocks included in the memory device 200a periodically. Instead, the memory controller 100 may only refresh memory blocks that are required to be refreshed. As such, the memory controller 100 may refresh memory blocks that currently store data.

For example, the memory controller 100 may select a memory block that needs to be refreshed among the plurality of memory blocks based on the start addresses of each of the plurality of memory blocks and provide a refresh command and a refresh address REFA corresponding to a start address of the selected memory block to the memory device 200a. The refresh command may be provided from the memory controller 100 to the control unit 210 through the command pins 101 and 201, and the refresh address REFA may be provided from the memory controller 100 to the address register 220 through the address pins 102 and 202.

The memory device 200a may refresh a memory block whose start address corresponds to the refresh address REFA among the plurality of memory blocks in response to the refresh command. For example, the address register 220 may provide the refresh address REFA to the control unit 210, the control unit 210 may provide the refresh address REFA to the refresh control circuit 400 in response to the refresh command and provide the refresh signal REF to the row address multiplexer 240 in response to the refresh command, and the refresh control circuit 400 may provide the row address multiplexer 240 with physical row addresses of a plurality of pages included in a memory block whose start address corresponds to the refresh address REFA as the refresh row address REF_ADDR.

As described above, the memory system 30 may not refresh all of the plurality of memory blocks included in the memory device 200a but may only refresh memory blocks that need to be refreshed. Therefore, an efficiency of a command bus of the memory system 30 may increase and a power consumption of the memory system 30 may decrease.

In addition, since the memory controller 100 receives the start addresses of each of the plurality of memory blocks included in the memory cell array 280 from the memory device 200a at startup of the memory system, when the memory controller 100 accesses a page, the memory controller 100 may figure out in which memory block the page is included. When consecutively accessing page included in a different memory block in a same bank array, new page may be open without precharging a currently open page.

Therefore, the memory controller 100 may provide consecutive active commands (e.g., write commands and/or read commands) to the memory device 200a with a first time interval of a predetermined row cycle time (tRC) when the consecutive active commands correspond to pages included in a same memory block, and provides consecutive active command (e.g., a write command and/or a read command) to the memory device 200a with a second time interval smaller than the first time interval when the consecutive active command correspond to a page included in different memory block. As such, an overall operation speed of the memory system 30 may increase.

In other example embodiments, the physical information stored in the multi-purpose register 300 may further include an operation speed of each of the plurality of memory blocks. For example, the physical information stored in the multi-purpose register 300 may further include a write recovery time (tWR) of each of the plurality of memory blocks.

For example, as illustrated in FIG. 5, when the memory cell array 280 includes first through n-th memory blocks 2811, 2812, . . . , 281n, the multi-purpose register 300 may store start addresses RADDL1, RADDL2, . . . , RADDLn of each of the first through n-th memory blocks 2811, 2812, . . . , 281n in relation with operation speeds SP1, SP2, . . . , SPn of each of the first through n-th memory blocks 2811, 2812, . . . , 281n. For example, the control unit 210 may consecutively provide pairs of the start addresses RADDL1, RADDL2, . . . , RADDLn and the operation speeds SP1, SP2, . . . , SPn of the first through n-th memory blocks 2811, 2812, . . . , 281n stored in the multi-purpose register 300 to the memory controller 100 in response to the MPR read command.

The memory controller 100 may set timing parameters for accessing the plurality of memory blocks differently for each of the plurality of memory blocks based on the start addresses and the operation speeds of each of the plurality of memory blocks received from the memory device 200a at startup of the memory system. The timing parameters may include a write recovery time (tWR), an access time (tAC), a row cycle time (tRC), etc. For example, the memory controller 100 may access a relatively high speed memory block with timing parameters having relatively small values and access a relatively slow speed memory block with timing parameters having relatively large values.

As described above, since the memory system 30 may set timing parameters for accessing the plurality of memory blocks differently for each of the plurality of memory blocks based on the operation speeds of the plurality of memory blocks, an operation speed of the memory system 30 may increase.

In still other example embodiments, the multi-purpose register 300 may further store a repair address corresponding to an address of a repaired page among the plurality of pages included in the memory cell array 280. The repaired page may be replaced by a page included in a redundancy memory block among the plurality of memory blocks.

Figure 6:
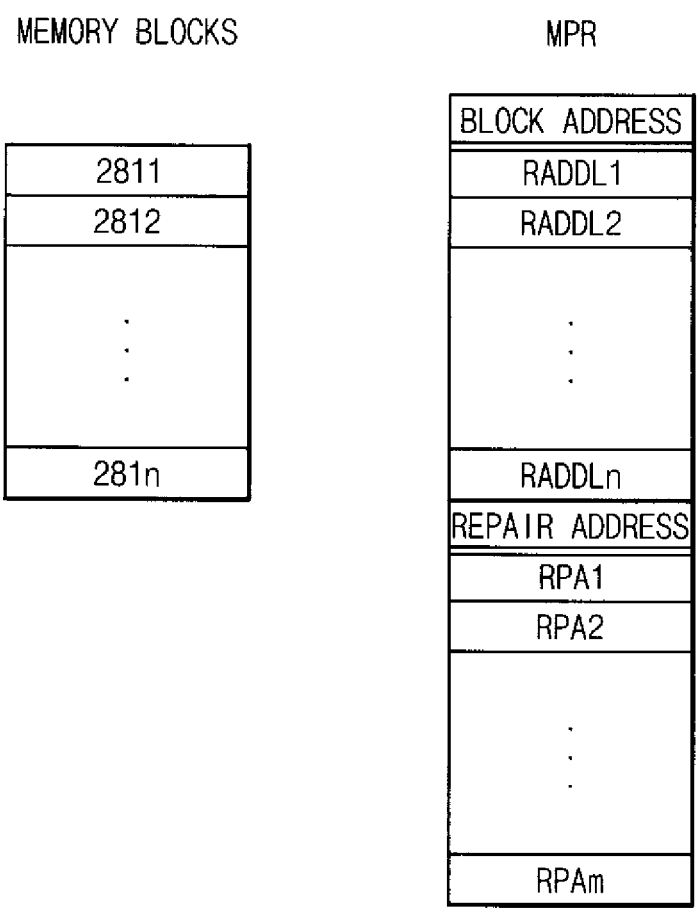
FIG. 6 is a diagram illustrating still another example of the multi-purpose register included in the memory device of FIG. 3.

For example, as illustrated in FIG. 6, when the memory cell array 280 includes first through n-th memory blocks 2811, 2812, . . . , 281n, the multi-purpose register 300 may store start addresses RADDL1, RADDL2, . . . , RADDLn of each of the first through n-th memory blocks 2811, 2812, . . . , 281n and repair addresses RPA1, RPA2, . . . , RPAm corresponding to addresses of repaired pages among the plurality of pages included in the memory cell array 280. For example, the control unit 210 may provide the start addresses RADDL1, RADDL2, . . . , RADDLn and the repair addresses RPA1, RPA2, . . . , RPAm stored in the multi-purpose register 300 to the memory controller 100 in response to the MPR read command.

Figure 7:
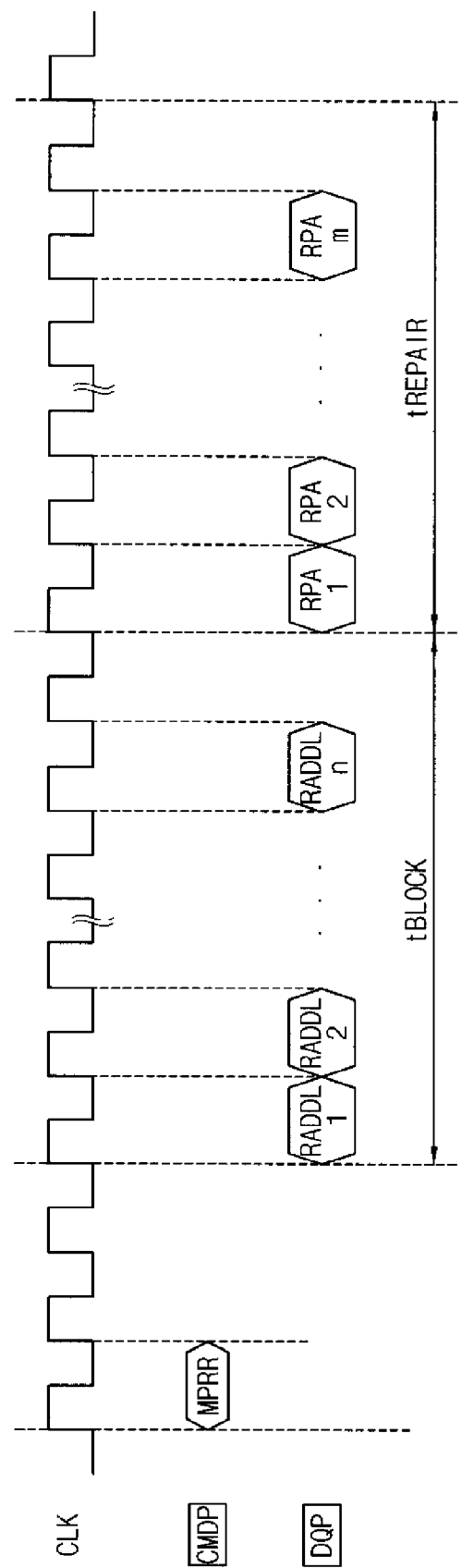
FIG. 7 is a timing diagram for describing an operation of the memory device of FIG. 3 according an exemplary embodiment.

FIG. 7 is a timing diagram for describing an operation of the memory device of FIG. 3 according an exemplary embodiment.

Referring to FIG. 7, when the control unit 210 receives the MPR read command MPRR from the memory controller 100 through the command pin CMDP 201, the control unit 210 may consecutively provide the start addresses RADDL1, RADDL2, . . . , RADDLn to the memory controller 100 through the data pin DQP 203 during a first time period tBLOCK and consecutively provide the repair addresses RPA1, RPA2, . . . , RPAm to the memory controller 100 through the data pin DQP 203 during a second time period tREPAIR. Durations of the first time period tBLOCK and the second time period tREPAIR may be determined based on a size of the memory cell array 280 and a number of the plurality of memory blocks.

Since the memory controller 100 receives the start addresses of each of the plurality of memory blocks included in the memory cell array 280 from the memory device 200a at startup of the memory system, when the memory controller 100 accesses a page, the memory controller 100 may figure out in which memory block the page is included. When consecutively accessing page included in a different memory block in a same bank array, new page may be open without precharging a currently open page.

Therefore, the memory controller 100 may provide consecutive active commands (e.g., write commands and/or read commands) to the memory device 200a with a first time interval of a predetermined row cycle time (tRC) when the consecutive active commands correspond to pages included in a same memory block, and provides consecutive active command (e.g., a write command and/or a read command) to the memory device 200a with a second time interval smaller than the first time interval when the consecutive active command correspond to a page included in a different memory block.

However, since the repaired pages are replaced by pages included in a redundancy memory block among the plurality of memory blocks, even though the consecutive active commands correspond to repaired pages included in different memory blocks, pages included in the same redundancy memory block may be consecutively accessed in response to the consecutive active commands. For example, if a time interval between the consecutive active commands is smaller than the predetermined row cycle time (tRC), an operation error may occur.

Therefore, the memory controller 100 may provide consecutive active commands (e.g., write commands and/or read commands) to the memory device 200a with the first interval of the predetermined row cycle time (tRC) when the consecutive active commands correspond to repaired pages included in different memory blocks.

As described above, since the memory device 200a further provides the memory controller 100 with the repair addresses of the repaired pages among the plurality of pages included in the memory cell array 280, the memory controller 100 may control a time interval between consecutive active commands based on both whether the consecutive active commands correspond to pages included in different memory blocks and whether the consecutive active commands correspond to repaired pages. As such, an overall operation speed of the memory system 30 may increase while reducing an operation error.

Figure 8:
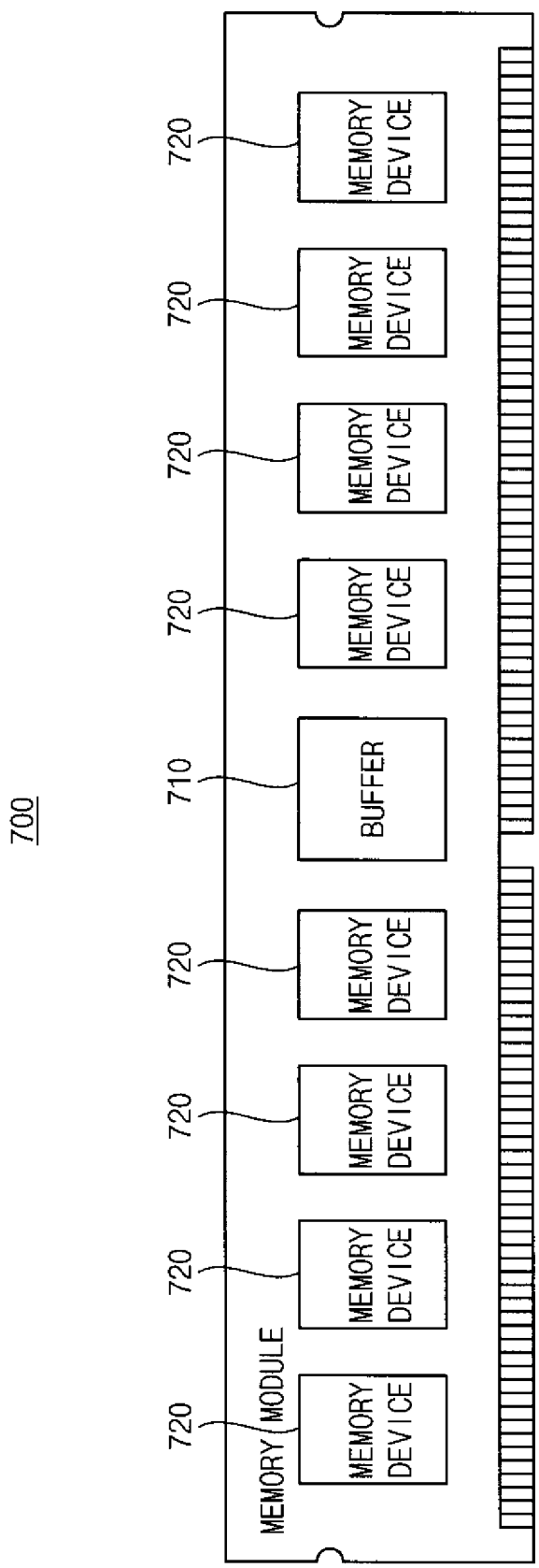
FIG. 8 is a block diagram illustrating a memory module according to exemplary embodiments.

FIG. 8 is a block diagram illustrating a memory module according to exemplary embodiments.

Referring to FIG. 8, a memory module 700 may include a plurality of memory devices 720. In some embodiments, the memory module 700 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 700 may further include a buffer 710 that receives a command signal, an address signal and data from a memory controller through a plurality of transmission lines and buffers the command signal, the address signal and the data to provide the plurality of memory devices 720 with the command signal, the address signal and the data.

In some example embodiments, data transmission lines between the buffer 710 and the plurality of memory devices 720 may be coupled in a point-to-point topology. Command transmission lines and address transmission lines between the buffer 710 and the plurality of memory devices 720 may be coupled in a multi-drop topology, a daisy-chain topology, a fly-by daisy-chain topology, or the like. Since the buffer 710 buffers the command signal, the address signal and the data, the memory controller may interface with the memory module 700 by driving only a load of the buffer 710. Accordingly, the memory module 700 may include more memory devices 720 and/or more memory ranks, and a memory system may include more memory modules 700.

The memory device 720 may include a multi-purpose register storing physical information of a plurality of memory blocks included in a memory cell array of the memory device 720. At startup of the memory system, the memory controller may provide a MPR read command to the memory device 720, and the memory device 720 may provide the physical information stored in the multi-purpose register to the memory controller in response to the MPR read command. The memory controller may control each of the plurality of memory blocks included in the memory device 720 differently based on the physical information of each of the plurality of memory blocks. As such, a performance of the memory system may increase. The memory device 720 may be embodied with the memory device 200a of FIG. 3. A structure and an operation of the memory device 200a are described above with reference to FIGS. 1 to 7. Therefore, a detail description of the memory device 720 will be omitted.

Figure 9:
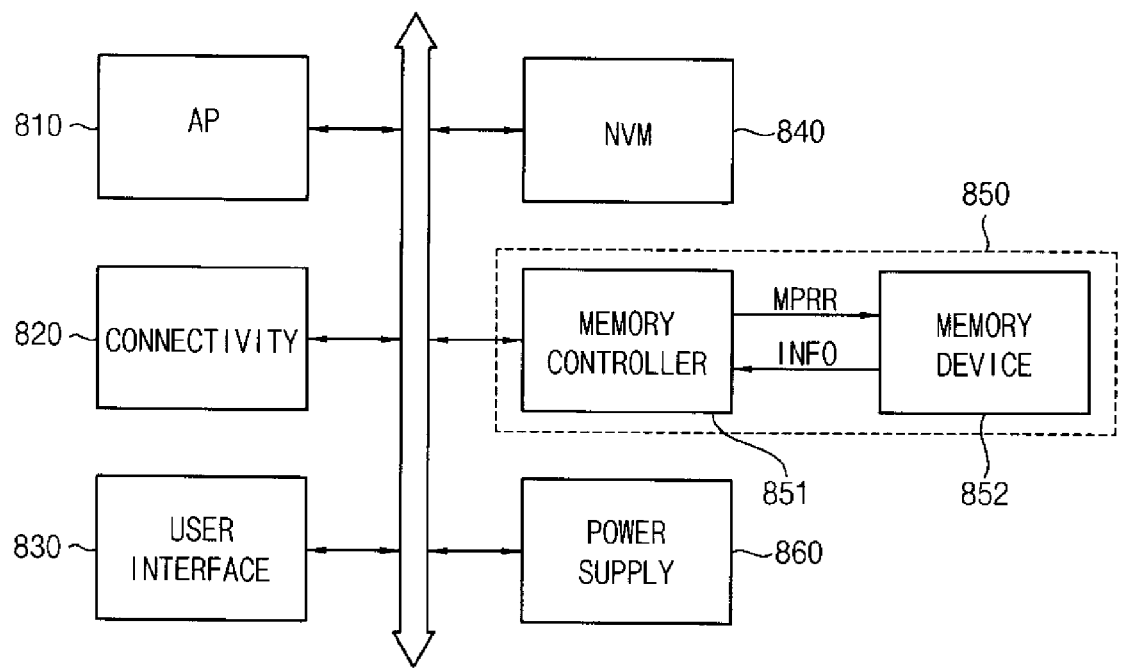
FIG. 9 is a block diagram illustrating a mobile system according to exemplary embodiments.

FIG. 9 is a block diagram illustrating a mobile system according to exemplary embodiments.

Referring to FIG. 9, a mobile system 800 may include an application processor 810, a connectivity unit 820, a user interface 830, a nonvolatile memory device NVM 840, a memory system 850 and a power supply 860. In some embodiments, the mobile system 800 may be, for example, a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as a global system for mobile communications (GSM), general packet radio service (GPRS), wideband code division multiple access (WCDMA), high speed downlink/uplink packet access (HSxPA), etc.

The memory system 850 may include a memory controller 851 and a memory device 852. The memory device 852 may store data processed by the application processor 810, or may operate as a working memory. The memory device 852 may include a multi-purpose register storing physical information INFO of a plurality of memory blocks included in a memory cell array of the memory device 852. At startup, the memory controller 851 may provide a MPR read command MPRR to the memory device 852, and the memory device 852 may provide the physical information INFO stored in the multi-purpose register to the memory controller 851 in response to the MPR read command MPRR. The memory controller 851 may control each of the plurality of memory blocks included in the memory device 852 differently based on the physical information INFO of each of the plurality of memory blocks. As such, a performance of the memory system 850 may increase. The memory system 850 may be embodied with the memory system 30 of FIG. 2. A structure and an operation of the memory system 30 are described above with reference to FIGS. 1 to 7. Therefore, a detail description of the memory system 850 will be omitted.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 may further include an image processor, and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 10:
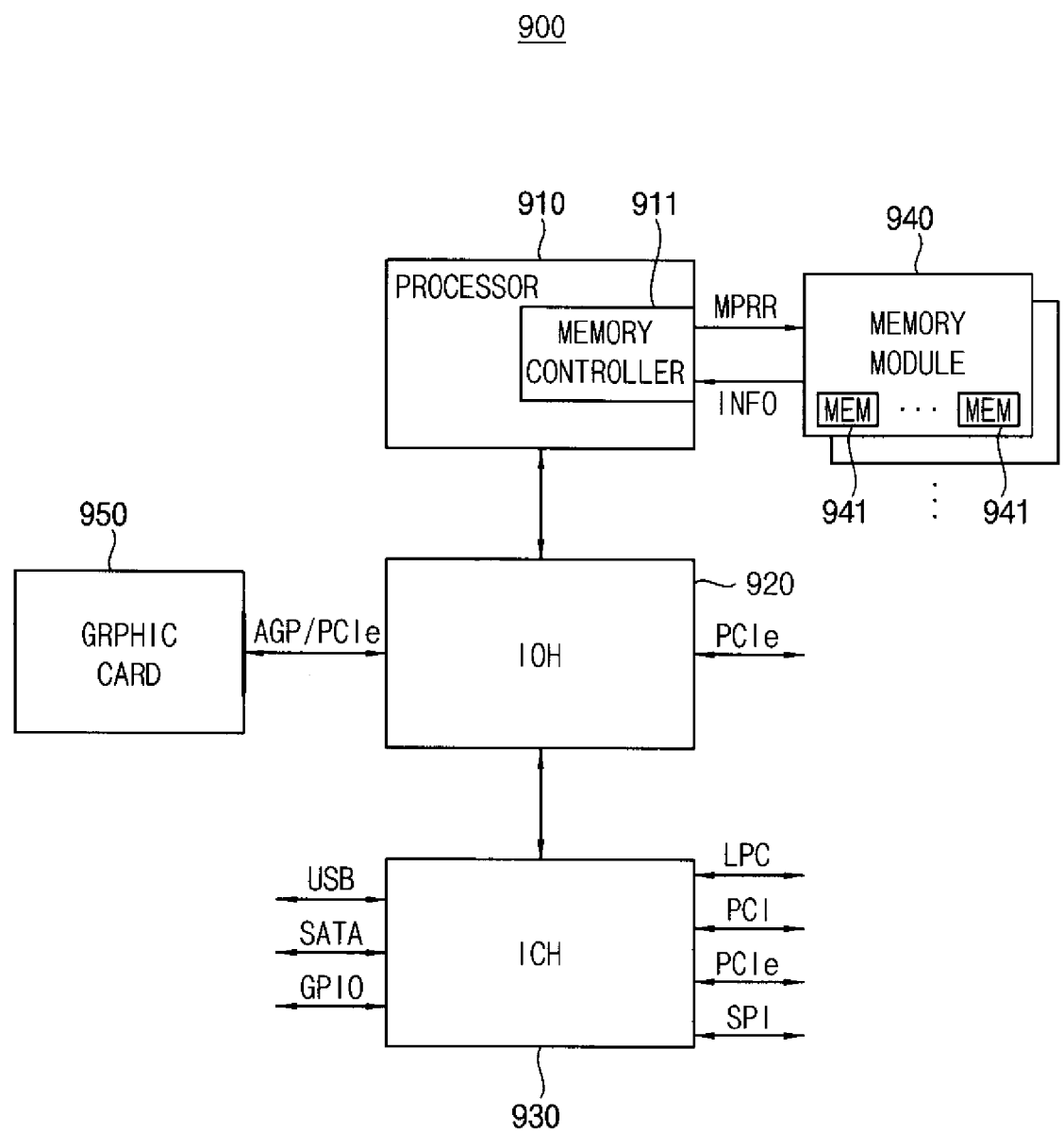
FIG. 10 is a block diagram illustrating a computing system according to exemplary embodiments.

FIG. 10 is a block diagram illustrating a computing system according to exemplary embodiments.

Referring to FIG. 10, a computing system 900 may include a processor 910, an input/output hub (IOH) 920, an input/output controller hub (ICH) 930, at least one memory module 940 and a graphics card 950. In some embodiments, the computing system 900 may be, for example, a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be such as a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 10 illustrates the computing system 900 including one processor 910, in some embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920. The input/output hub 920 including the memory controller 911 may be referred to as memory controller hub (MCH).

The memory module 940 may include a plurality of memory devices MEM 941 that store data provided from the memory controller 911. The memory device 941 may include a multi-purpose register storing physical information INFO of a plurality of memory blocks included in a memory cell array of the memory device 941. At startup, the memory controller 911 may provide a MPR read command MPRR to the memory device 941, and the memory device 941 may provide the physical information INFO stored in the multi-purpose register to the memory controller 911 in response to the MPR read command MPRR. The memory controller 911 may control each of the plurality of memory blocks included in the memory device 941 differently based on the physical information INFO of each of the plurality of memory blocks. As such, a performance of a memory system including the memory controller 911 and the memory device 941 may increase. The memory system including the memory controller 911 and the memory device 941 may be embodied with the memory system 30 of FIG. 2. A structure and an operation of the memory system 30 are described above with reference to FIGS. 1 to 7. Therefore, a detail description of the memory controller 911 and the memory device 941 will be omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a Quick-Path interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 10 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The foregoing is illustrative of the present disclosure and is not to be construed as limiting thereof. Although a few example embodiments have been described, those skilled in the art will readily appreciate that many modifications are possible in the example embodiments without materially departing from the novel teachings and advantages of the disclosed embodiments. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory system, comprising:
    a memory device including a memory cell array and a multi-purpose register (MPR) configured to store physical information of a plurality of memory blocks included in the memory cell array; and
    a memory controller configured to control the memory device, and configured to provide an MPR read command to the memory device at startup of the memory system,
    wherein the memory device provides the physical information stored in the multi-purpose register to the memory controller in response to the MPR read command,
    wherein the physical information includes address information of each of the plurality of memory blocks,
    wherein the memory controller is configured to select a memory block that is required to be refreshed among the plurality of memory blocks based on the address information and provide a refresh command and a refresh address corresponding to a start address of the selected memory block to the memory device,
    wherein each of the plurality of memory blocks includes a plurality of pages, and
    wherein the memory controller is configured to provide consecutive active commands to the memory device with a first interval between consecutive active commands when the consecutive active commands correspond to pages included in a same memory block, and provide consecutive active command to the memory device with a second interval smaller than the first interval between consecutive active commands when the consecutive active command correspond to a page included in a different memory block.

2. The memory system of claim 1, wherein a refresh control circuit of the memory device is configured to receive the refresh address and refresh a memory block based on the refresh address corresponding to the address information of the memory block.

3. The memory system of claim 1, wherein the multi-purpose register is further configured to store a repair address corresponding to an address of a repaired page among the plurality of pages, and
    wherein the memory device is further configured to provide the repair address stored in the multi-purpose register to the memory controller in response to the MPR read command.

4. The memory system of claim 3, wherein the memory controller provides consecutive active commands to the memory device with the first interval between consecutive active commands when the consecutive active commands correspond to repaired pages included in different memory blocks.

5. The memory system of claim 1, wherein the physical information is provided through a data pin in response to the MPR read command.

* * * * *